(12) United States Patent
Wu et al.

(10) Patent No.: US 10,656,539 B2
(45) Date of Patent: May 19, 2020

(54) RADIATION SOURCE FOR LITHOGRAPHY PROCESS

(71) Applicant: Taiwan Semiconductor Manufacturing Co., Ltd., Hsinchu (TW)

(72) Inventors: Shang-Ying Wu, Hsinchu County (TW); Shang-Chieh Chien, New Taipei (TW); Bo-Tsun Liu, Taipei (TW); Li-Jui Chen, Hsinchu (TW); Po-Chung Cheng, Zhongpu Township, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/117,545

(22) Filed: Aug. 30, 2018

(65) Prior Publication Data
US 2019/0155179 A1    May 23, 2019

Related U.S. Application Data

(60) Provisional application No. 62/589,217, filed on Nov. 21, 2017.

(51) Int. Cl.
*G03F 7/20* (2006.01)
*H05G 2/00* (2006.01)

(52) U.S. Cl.
CPC ...... *G03F 7/70925* (2013.01); *G03F 7/70025* (2013.01); *G03F 7/70033* (2013.01); *G03F 7/70175* (2013.01); *H05G 2/008* (2013.01)

(58) Field of Classification Search
CPC ............ G03F 7/70033; G03F 7/70025; G03F 7/70925

See application file for complete search history.

(56) References Cited

U.S. PATENT DOCUMENTS

| | | | |
|---|---|---|---|
| 7,812,330 B2 * | 10/2010 | Banine | G03F 7/70933 250/492.1 |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 8,928,855 B2 * | 1/2015 | Moors | G03F 7/70925 355/30 |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,377,693 B2 | 6/2016 | Huang et al. | |
| 9,529,268 B2 | 12/2016 | Chang et al. | |

(Continued)

*Primary Examiner* — Steven Whitesell Gordon
(74) *Attorney, Agent, or Firm* — Birch, Stewart, Kolasch & Birch, LLP

(57) ABSTRACT

A method for a lithography exposure process is provided. The method includes irradiating a target droplet with a laser beam to create an extreme ultraviolet (EUV) light. The method further includes reflecting the EUV light with a collector. The method also includes discharging a cleaning gas over the collector through a gas distributor positioned next to the collector. A portion of the cleaning gas is converted to free radicals before the cleaning gas leaves the gas distributor, and the free radicals are discharged over the collector along with the cleaning gas.

20 Claims, 7 Drawing Sheets

(56) References Cited

U.S. PATENT DOCUMENTS

| | | | |
|---|---|---|---|
| 9,548,303 B2 | 1/2017 | Lee et al. | |
| 2004/0165160 A1* | 8/2004 | Van Beek | B08B 7/0057 |
| | | | 355/30 |
| 2006/0072084 A1* | 4/2006 | Van Herpen | B08B 7/0035 |
| | | | 355/30 |
| 2006/0163500 A1* | 7/2006 | Inoue | B82Y 10/00 |
| | | | 250/493.1 |
| 2007/0018119 A1* | 1/2007 | Yabuta | B82Y 10/00 |
| | | | 250/493.1 |
| 2007/0125964 A1* | 6/2007 | Van Herpen | B82Y 10/00 |
| | | | 250/492.2 |
| 2007/0131878 A1* | 6/2007 | Banine | B82Y 10/00 |
| | | | 250/492.2 |
| 2007/0145296 A1* | 6/2007 | Freriks | B82Y 10/00 |
| | | | 250/492.2 |
| 2008/0011967 A1* | 1/2008 | Van Herpen | G03F 7/70916 |
| | | | 250/492.2 |
| 2011/0226745 A1* | 9/2011 | Nagai | G03F 7/70033 |
| | | | 219/121.62 |
| 2013/0026393 A1* | 1/2013 | Abe | H05G 2/005 |
| | | | 250/504 R |
| 2013/0126761 A1* | 5/2013 | Nagai | H05G 2/005 |
| | | | 250/504 R |
| 2013/0319466 A1* | 12/2013 | Mizoguchi | G03F 7/70925 |
| | | | 134/18 |
| 2015/0261094 A1 | 9/2015 | Huang et al. | |
| 2015/0338753 A1* | 11/2015 | Riepen | G03F 7/70033 |
| | | | 250/504 R |
| 2017/0036252 A1* | 2/2017 | De Dea | B08B 5/02 |

\* cited by examiner

RADIATION SOURCE FOR LITHOGRAPHY PROCESS

PRIORITY CLAIM AND CROSS-REFERENCE

This application claims the benefit of U.S. Provisional Application No. 62/589,217, filed on Nov. 21, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that may be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1 nm to about 100 nm. Some EUV scanners provide a projection printing, similar to some optical scanners, except that the EUV scanners use reflective rather than refractive optics, i.e., mirrors instead of lenses.

One type of EUV light source is laser-produced plasma (LPP). LPP technology produces EUV light by focusing a high-power laser beam onto small fuel droplet targets to form highly ionized plasma that emits EUV light with a peak of maximum emission at 13.5 nm. The EUV light is then collected by a collector and reflected by optics towards a lithography exposure object, e.g., a wafer.

Although existing methods and devices for generating EUV light have been adequate for their intended purposes, they have not been entirely satisfactory in all respects. Consequently, it would be desirable to provide a solution for increasing power conversion efficiency from the input energy for ionization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
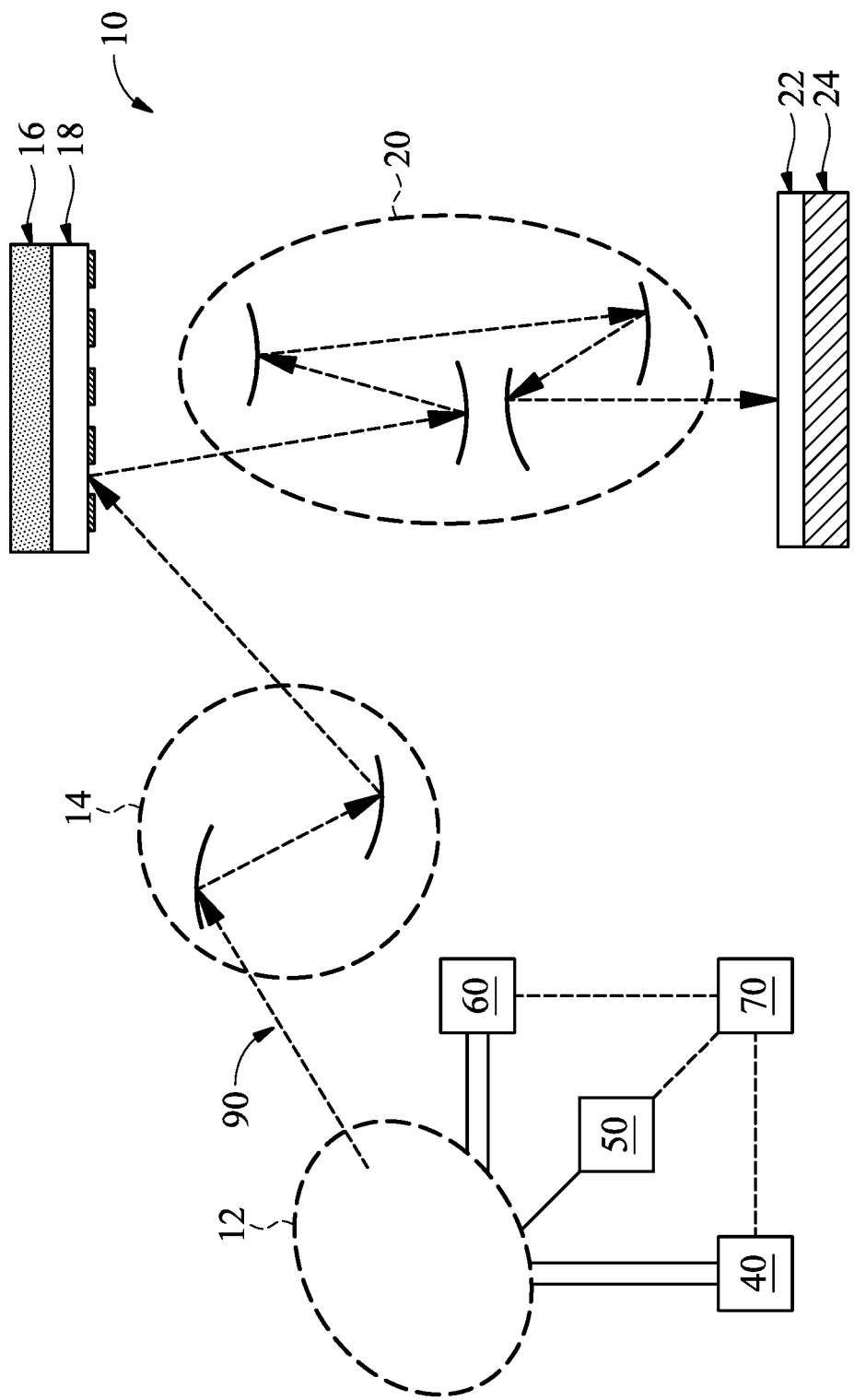
FIG. 1 is a schematic view of a lithography system, constructed in accordance with some embodiments of the present disclosure.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The processing apparatus may be otherwise oriented (rotated 90 degrees or at other orientations) and the spatially relative descriptors used herein may likewise be interpreted accordingly. It should be understood that additional operations may be provided before, during, and after the method, and some of the operations described may be replaced or eliminated for other embodiments of the method.

The advanced lithography process, method, and materials described in the current disclosure may be used in many applications, including fin-type field effect transistors (FinFETs). For example, the fins may be patterned to produce a relatively close spacing between features, for which the above disclosure is well suited. In addition, spacers used in forming fins of FinFETs may be processed according to the above disclosure.

The present disclosure is generally related to extreme ultraviolet (EUV) lithography system and methods. More particularly, it is related to apparatus and methods for mitigating contamination on a collector in a laser produced plasma (LPP) EUV light source. The collector, also referred to as LPP collector or EUV collector, is configured to collect and reflect EUV light and contribute to EUV conversion efficiency and lithography throughput. However, LPP collector is subjected to damages and degradations due to the impact of particles, ions, radiation, and debris deposition. An object of the present disclosure is directed to reducing debris deposition onto the LPP collector, thereby increasing its usable lifetime.

FIG. 1 is a schematic view of a lithography system 10, constructed in accordance with some embodiments. The lithography system 10 may also be generically referred to as a scanner that is operable to perform lithography exposure processes. In the present embodiment, the lithography system 10 is an extreme ultraviolet (EUV) lithography system designed to expose a resist layer by EUV light. The resist layer is a material sensitive to the EUV light.

In some embodiments, the EUV lithography system 10 employs a radiation source 12 to generate EUV light 90, such as EUV light having a wavelength ranging between about 1 nm and about 100 nm. In one particular example, the EUV light 90 has a wavelength centered at about 13.5 nm. Accordingly, the radiation source 12 is also referred to as an EUV light source. The EUV light source may utilize a mechanism of laser-produced plasma (LPP) to generate the EUV light, which will be further described later.

The lithography system 10 also employs an illuminator 14. In some embodiments, the illuminator 14 includes various reflective optics such as a single mirror or a mirror system having multiple mirrors in order to direct the EUV light 90 from the radiation source 12 onto a mask stage 16, particularly to a mask 18 secured on the mask stage 16.

The lithography system 10 also includes the mask stage 16 configured to secure the mask 18. In some embodiments, the mask stage 16 includes an electrostatic chuck (e-chuck) to secure the mask 18. In the present disclosure, the terms mask, photomask, and reticle are used interchangeably. In the present embodiment, the lithography system 10 is an EUV lithography system, and the mask 18 is a reflective mask.

One exemplary structure of the mask 18 includes a substrate with a low thermal expansion material (LTEM). For example, the LTEM may include $TiO_2$ doped $SiO_2$, or other suitable materials with low thermal expansion. The mask 18 includes a reflective multi-layer (ML) deposited on the substrate. The ML includes a number of film pairs, such as molybdenum-silicon (Mo/Si) film pairs (e.g., a layer of molybdenum above or below a layer of silicon in each film pair).

Alternatively, the ML may include molybdenum-beryllium (Mo/Be) film pairs, or other suitable materials that are configurable to highly reflect the EUV light 90. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). The mask 18 may have other structures or configurations in various embodiments.

The lithography system 10 also includes a projection optics module (or projection optics box (POB)) 20 for imaging the pattern of the mask 18 on to a semiconductor substrate 22 secured on a substrate stage (or wafer stage) 24 of the lithography system 10. The POB 20 includes reflective optics in the present embodiment. The EUV light 90 directed from the mask 18, carrying the image of the pattern defined on the mask 18, is collected by the POB 20. The illuminator 14 and the POB 20 may be collectively referred to as an optical module of the lithography system 10.

In the present embodiment, the semiconductor substrate 22 is a semiconductor wafer, such as a silicon wafer or other type of wafer to be patterned. The semiconductor substrate 22 is coated with a resist layer sensitive to the EUV light 90 in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas-supply module 40. The gas-supply module 40 is designed to provide a cleaning gas (e.g., hydrogen gas) to the radiation source 12. The cleaning gas helps reduce contamination in the radiation source 12. In addition, the lithography system 10 includes an exhaust module 60. The exhaust module 60 is designed to extract debris, such as ions, gases and atoms of the target droplet (which will be described in detail below), out of the radiation source 12.

In the present embodiment, the lithography system 10 further includes a radio frequency device 50. The radio frequency device 50 is designed to generate an electric field in the radiation source 12 to convert the cleaning gas into free radicals. In one certain embodiment, the lithography system 10 also includes a controller 70. The controller 70 controls the operation of the radiation source 12, the gas-supply module 40, the radio frequency device 50, and the exhaust module 60.

The collaboration of the radiation source 12, the gas-supply module 40, the radio frequency device 50, and the exhaust module 60 is further discussed below.

Figure 2:
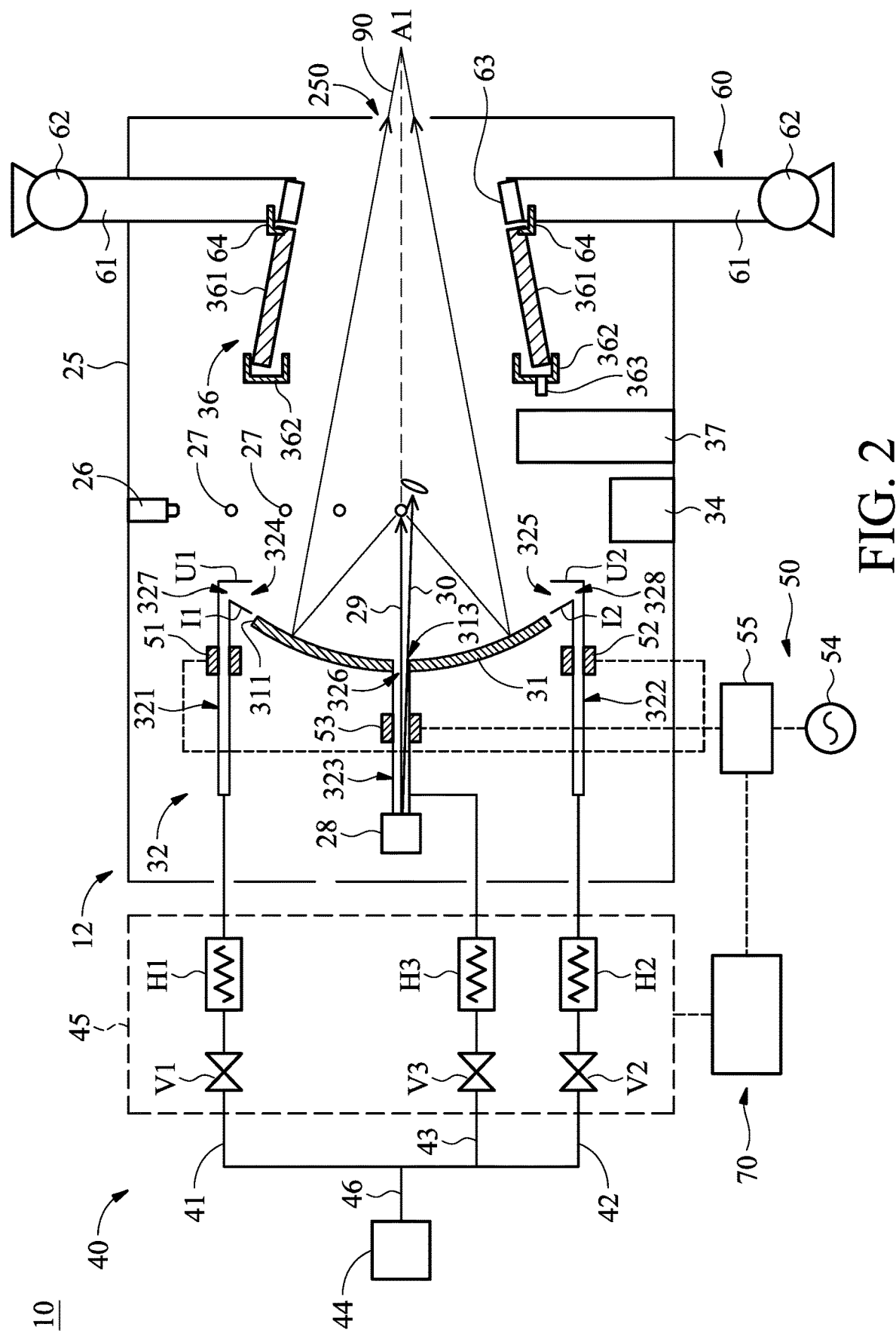
FIG. 2 is a partial view of a lithography system, including a radiation source, a gas-supply module, an exhaust module, a radio frequency device, and a controller in a diagrammatical view, in accordance with some embodiments.

Referring to FIG. 2, in some embodiments, the radiation source 12 employs a laser produced plasma (LPP) mechanism to generate plasma and further generate EUV light from the plasma and includes a target droplet generator 26, a laser source configuration 28, a collector 31, and a gas distributor 32, a droplet catcher 34, and a debris collection mechanism (DCM) 36. The radiation source 12 may be configured in a source vessel 25 which is maintained in a vacuum environment.

The target droplet generator 26 is configured to generate a number of target droplets 27. In one certain embodiment, the target droplets 27 are tin (Sn) droplets. In some examples, the target droplets 27 each may have a diameter about 30 microns ($\mu m$) and are generated at a rate about 50 kilohertz (kHz). The target droplets 27 are introduced into a zone of excitation in the radiation source 12 at a speed about 70 meters per second (m/s) in one example. Other material may also be used for the target droplets 27, for example, a tin-containing liquid material such as eutectic alloy containing tin, lithium (Li), and xenon (Xe).

The laser source configuration 28 may include a carbon dioxide (CO2) laser source, a neodymium-doped yttrium aluminum garnet (Nd:YAG) laser source, or other suitable laser source to generate two laser beams 29 and 30. Normally, the laser beams may be adopted pre-pulse (PP) laser 29 and main-pulse (MP) laser 30 configurations. Those pulse lasers are directed through an aperture 313 formed on the collector 31. The PP laser 29 with sufficient power and pulse duration is to heat the target droplet 27 firstly and then the shape of droplet may become such pancake-like or dome-like tin mist, which is also called the precursor target. Furthermore, the MP laser 30 with relatively higher power and appropriate duration is fired at a certain angle to hit that tin mist, thereby generating high-temperature plasma. EUV light 90 is radiated by that important plasma. Those laser properties may be applied in the range of power of such 1 to 30 kilowatt and pulse duration of such femtosecond order to nanosecond order, which are related to desired EUV power within the range of several watts to hundreds of watts. In some embodiments, the pulses of the laser source configuration 28 and the droplet generating rate of the target droplet generator 26 are controlled to be synchronized such that the target droplets 27 consistently receive peak powers from the PP laser 29 and the MP laser 30 of the laser source configuration 28.

The droplet catcher 34 is configured to catch any target droplets that are missed by the laser beams 29 and 30. The droplet catcher 34 is installed opposite the target droplet generator 26 and in the direction of the movement of the target droplets 27. In some embodiments, the target droplet generator 26 and the droplet catcher 34 are positioned at two sides of the collector 31.

The collector 31 is configured to collect, reflect and focus the EUV light 90. In some embodiments, the collector 31 is designed to have an ellipsoidal geometry with an aperture 313 formed thereon. The aperture 313 may be formed on a center of the collector 31. Alternatively, the aperture 313 may be located offset from the center of the collector 31. In one certain embodiment, the laser source configuration 28 is positioned relative to the aperture 313, and the laser beams 29 and 30 emitted by the laser source configuration 28 passes through the aperture 313 before its irradiation upon the target droplet 27.

In some embodiments, the collector 31 is designed with proper coating material functioning as a mirror for EUV light 90 collection, reflection, and focus. In some examples, the coating material of the collector 31 is similar to the reflective multilayer of the mask 18 (FIG. 1). In some examples, the coating material of the collector 31 includes a number of Mo/Si film pairs and may further include a capping layer (such as Ru) coated on the film pairs to substantially reflect the EUV light. In some examples, the collector 31 may further include a grating structure designed to effectively scatter the laser beam directed onto the collector 31. For example, a silicon nitride layer may be coated on the collector 31 and patterned to have a grating structure.

The gas distributor 32 is configured to discharge the cleaning gas from the gas-supply module 40 to the collector 31. In some embodiments, the gas distributor 32 includes a number of flow guiding members, such as flow guiding members 321, 322 and 323. The flow guiding member 323 is positioned relative to the aperture 313. The flow guiding member 323 may include a tube structure and extends along a straight line. One end 326 of the flow guiding member 323 is directly connected to the aperture 313 and the other end is connected to the laser source configuration 28.

Figure 3:
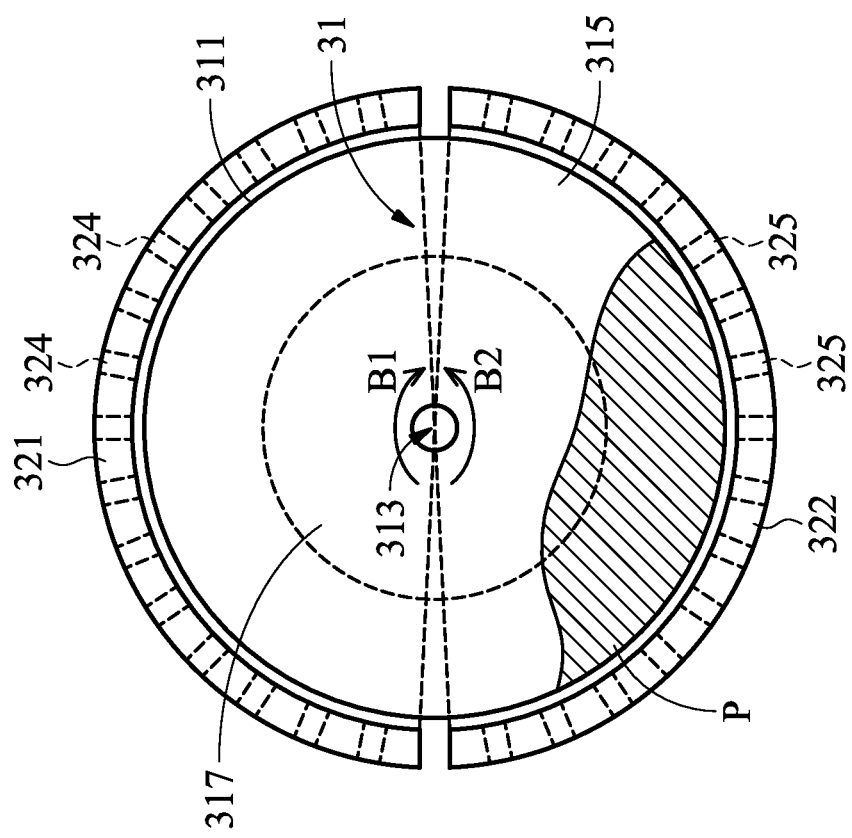
FIG. 3 is a side view of a collector and a gas distributor, in accordance with some embodiments as seen from an excitation zone of droplet targets, wherein a lower area of the collector is contaminated by debris.

The flow guiding members 321 and 322 are positioned at two sides of the collector 31. Each of the flow guiding members 321 and 322 is formed with a tube structure and includes one or more gas holes located next to the circumference 311 of the collector 31. For example, as shown in FIG. 3, the flow guiding member 321 includes a number of gas holes 324 positioned relative to the circumference 311 of the collector 31. The gas holes 324 may be configured with the same size, and spaced apart from each other by a predetermined pitch. In addition, the flow guiding member 322 includes a number of gas holes 325 positioned relative to the circumference 311 of the collector 31. The gas holes 325 may be configured with the same size, and spaced apart from one another by a predetermined pitch.

In some embodiments, as shown in FIG. 3, each of the flow guiding members 321 and 322 has an arc-shape cross-section in a plane that is perpendicular to an optical axis A1 (FIG. 2) along which the EUV light 90 is transmitted. The flow guiding members 321 and 322 extends along the circumference 311 of the collector 31. A sum of an arc angle B1 of the flow guiding member 321 and an arc angle B2 of the flow guiding member 322 in their cross-sections is slightly less than 360 degrees. That is, the circumference 311 of the collector 31 is substantially surrounded by the flow guiding members 321 and 322.

Referring again to FIG. 2, in some embodiments, each of the flow guiding members 321 and 322 has a cane-like shape cross-section in a plane that is parallel to the optical axis A1. Specifically, the flow guiding member 321 has an end portion 327 connected to the gas hole 324, and the flowing guiding member 322 has an end portion 328 connected to the gas hole 325. Extension directions of two side walls of the end portions 327 and 328 intersect with the optical axis A1 by different angles. In one certain embodiment, upper side walls U1 and U2 of the end portions 327 and 328 intersects with the optical axis A1 at an angle about 90 degree, and inner side walls I1 and I2 of the end portions 327 and 328 intersects with the optical axis A1 at an angle less than 90 degrees. As a result, the cleaning gas discharged by the flow guiding members 321 and 322 is redirected to form gas shield toward the surface of collector 31 that is used to reflected and focus the EUV light 90.

The gas-supply module 40 is fluidly connected to the gas distributor 32 and is configured to supply the cleaning gas to the collector 31 via the gas distributor 32. In some embodiments, the gas-supply module 40 includes a gas source 44 and a number of pipelines, such as pipelines 41, 42 and 43. The pipeline 41 fluidly connects the gas source 44 to the flow guiding member 321. The pipeline 42 fluidly connects the gas source 44 to the flow guiding member 322. The pipeline 43 fluidly connects the gas source 44 to the flow guiding member 323.

In some embodiments, since the pipelines 41, 42 and 43 and the flow guiding members 321, 322 and 323 collectively guide cleaning gas supplied from the gas source 44 to the collector 31, the pipelines 41, 42 and 43 and the flow guiding members 321, 322 and 323 are referred to as a gas flowing path.

The gas-supply module 40 further includes a regulating unit 45 configured to regulate the flow of the cleaning gas in the gas-supply module 40 according to a control signal from the controller 70. In some embodiments, the regulating unit 45 includes one or more valves configured to control flowing rate of the cleaning gas in the pipelines 41, 42 and 43. For example, the regulating unit 45 includes three flow rate regulators V1, V2 and V3, such as valves. The three flow rate regulators V1, V2 and V3 are respectively connected to the pipelines 41, 42 and 43. The three flow rate regulators V1, V2 and V3 may be independently controlled by the controller 70 to allow the cleaning gas in the pipelines 41, 42 and 43 have different flowing rates.

In some embodiments, the regulating unit 45 further includes one or more energy converters configured to control temperature of the cleaning gas in the pipelines 41, 42 and 43. For example, the regulating unit 45 includes three energy converters H1, H2 and H3. The three energy converters H1, H2 and H3 are respectively connected to the pipelines 41, 42 and 43. The three energy converters H1, H2 and H3 include heating members that convert electric energy into thermal energy. The energy converters H1, H2 and H3 apply the thermal energy into the cleaning gas in the pipelines 41, 42 and 43 to heat up the cleaning gas to a predetermined temperature. In the following descriptions, the energy converters H1, H2 and H3 are referred to as "first energy converters".

The predetermined temperature may be a temperature at which at least a portion of cleaning gas is converted to free radicals. That is, at the predetermined temperature, a specific bond between two atoms of the cleaning gas is broken so as to form the free radicals of the cleaning gas. Alternatively, the predetermined temperature may be a temperature that improves the conversion efficiency of the cleaning gas into free radicals as an electromagnetic radiant energy from the radio frequency device 50 is applied to the pre-heated cleaning gas. The first energy converters H1, H2 and H3 may be independently controlled by the controller 70 to allow the cleaning gas in the pipelines 41, 42 and 43 have different temperatures.

However, it should be appreciated that many variations and modifications may be made to embodiments of the disclosure. In some embodiments, a conduit 46 connects the gas source 44 and the pipelines 41, 42 and 43. The regulating unit 45 includes one valve and one first energy converters connected to the pipelines 41, 42 and 43. In some other embodiments, the pipelines 41, 42 and 43 are omitted, and the gas source 44 is directly connected to the gas distributor 32 via the conduit 46.

Still referring to FIG. 2, the radio frequency device 50 is configured to convert the cleaning gas in the gas distributor 32 into free radicals by electromagnetic radiant energy before the cleaning gas is discharged over the collector 31. In some embodiments, the radio frequency device 50 includes a number of energy converters, such as energy converters 51, 52 and 53. The energy converters 51, 52 and 53 are respectively connected to the flow guiding members 321, 322 and 323. In one certain embodiments, each of the energy converters 51, 52 and 53 includes a pairs of electrodes. The energy converters 51, 52 and 53 convert electric energy to electromagnetic radiant energy. In the following descriptions, the energy converters 51, 52 and 53 are referred to as "second energy converters".

The radio frequency device 50 further includes a power source 54 electrically connected to the second energy converters 51, 52 and 53 to supply electrical energy to the second energy converters 51, 52 and 53. The power source 54 may be connected to the second energy converters 51, 52 and 53 via a control circuit 55. The control circuit 55 controls the voltage applied to the second energy converters 51, 52 and 53 according to the control signal from the controller 70.

The DCM 36 is configured to trap the debris of the target droplet 27. The DCM 36 is disposed along the optical axis A1 connecting the aperture 313 of the collector 31 and an output port 250 of the source vessel 25. The DCM 36 includes a number of vanes 361 that are arranged surrounding the optical axis A1. The vanes 361 are thin and elongate plates and are aligned so that their longitudinal axes are parallel to the optical axis A1. The vanes 361 project towards the optical axis A1, but do not extend as far as the optical axis. The DCM 36 is configured to guide any tin debris attached on vanes structure. As a result, the vanes 361 serve to prevent such tin drops directly fallen on surface of the collector 31.

The vanes 361 are configured to guide those attached tins smoothly with practical thermal control, which temperature may be performed with warm and hot cycle. The hot cycle is intended to melt tin and avoid contamination of bubble defect burst of such spitting temperature, and hence that temperature is in the range from about 232° C. to about 350° C. The spitting temperature range may depend on internal gas components and chamber pressure like here example mentioned under conditions of almost H2 and medium vacuum of several mbar. The warm cycle is to let those tin debris slide and roll along vane surfaces appropriately in such range from about 100° C. to about 232° C. Consequently, the vane temperature range should be covered from about 100° C. to about 350° C. and melting tins will be collected and attached well along vane structure. Furthermore, the tin debris trapped by the vanes may flow smoothly into the bottom vane gutter 362 and then gather together here. Finally, those melting tins flow through the drip pipe 363 and fall into a bucket 37 for tin waste storage. In one certain embodiment, the EUV light 90 are projected upwardly along the optical axis A1, and thus the melting tins is moved via gravity force.

The vanes 361 are made of a suitable material such as stainless steel, Cu, A1 or ceramics. In certain embodiments, the vanes 361 are made of stainless steel. In the present embodiments, the surfaces of vanes 361, are coated with a catalytic layer including ruthenium (Ru), tin (Sn), tin oxide, titanium oxide, or any combination thereof. In some embodiments, Ru is used. The Ru coated surfaces of the vanes 361 reduce SnH4 to Sn, and traps Sn thereon.

By applying a catalytic layer made of, for example, Ru, on the surface of vanes in the DCM 36, it is possible to reduce SnH4 vapor to metal Sn and to collect debris directly, and thus it is possible to prevent contamination of Sn debris on the collector 31. Therefore, it is possible to extend a life of the collector 31 in the radiation source 12 for an EUV lithography system. However, it should be appreciated that when the target droplet used to generate EUV radiation is made of a different material than Sn, the same or a different catalytic material may be used as the catalytic material layer.

The exhaust module 60 includes an exhaust line 61, an exhaust pump 62, a heated scrubber 63 and a scrubber gutter 64. The exhaust line 61 is connected to and around the source vessel 25 to receive the exhaust. The heated scrubber 63 is connected to the exhaust line 61 and is configured to guide and trap the debris gas flow (or debris vapor). For example, the heated scrubber 63 has functions of a thermal control for heating or warming, an exhaust filtering and a debris trapping, which may include certain structure(s), such as labyrinth structures, nano rods, and porous macrostructures. When the debris hits the structure, it is heated and condensed into liquid, thereby being "trapped" inside the heated scrubber 63. Those melting tins may be guided by its fan-like structure and gathered together and fallen into scrubber gutter 64. As a result, the melting tins are collected and drained into the vane structure of DCM 36.

Another end of the exhaust line 61 is connected to the pump 62 which is a vacuum pump such as a vacuum pump made by Edwards Vacuum. The pump 62 creates airflow from the source vessel 25 into the heated scrubber 63 and the exhaust line 61, to pump out the exhaust in the source vessel 25. The exhaust of source vessel 25 may be further directed into the factory exhaust system.

It should be appreciated that while there is three flow guiding members 321, 322 and 323 are illustrated in FIG. 2, this is merely intended for clarity and is not intended to be limiting. Rather, any number of the flow guiding members may additionally be included within the radiation source 12.

Figure 4:
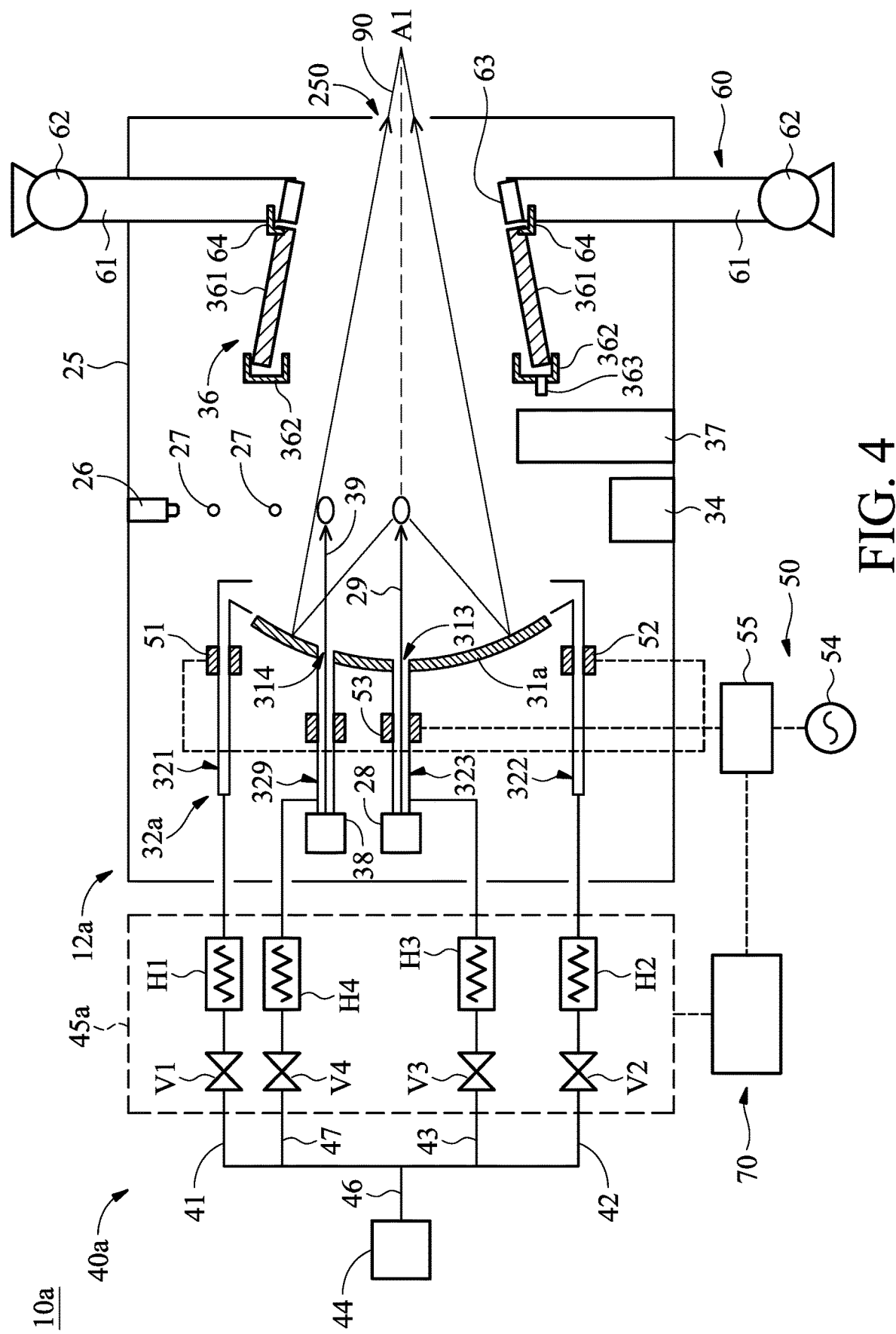
FIG. 4 is a partial view of a lithography system, including a radiation source, a gas-supply module, an exhaust module, a radio frequency device, and a controller in a diagrammatical view, in accordance with some embodiments.

For example, FIG. 4 illustrates a partial view of another lithography system 10a, including a radiation source 12a, a collector 31a, a gas-supply module 40a, the radio frequency device 50, the exhaust module 60, and the controller 70 in a diagrammatical view, in accordance with some embodiments. In the embodiment shown in FIG. 4, the radiation source 12a employs a flexible dual LPP mechanism.

The radiation source 12a includes a pre-heat laser source system 38. The pre-heat laser source 38 is positioned relative to an aperture 314 formed on a collector 31a and configured to radiate a pre-pulse laser 39 on the target droplets 27. This laser source has an own control freedoms, which may provide a more flexible pre-heated target. Afterwards, the main-pulse laser source 28 with higher power will be fired to hit that target under its control freedoms. Afterwards, this cascade process with two flexible laser controls may provide more adjustable conditions for the plasma generation. In addition, a gas-supply module 32a of the radiation source 12a includes a flow guiding member 329. The flow guiding member 329 connects the pre-heat laser source 38 to the aperture 314. The gas-supply module 40a of the radiation source 12a includes a pipeline 47 connected to the flow guiding member 324. A regulating unit 45a of the gas-supply module 40a includes a valve V4 and an energy converter (such as heating member) H4 mounted on the pipeline 47 to regulate the flow in the pipeline 47.

Figure 5:
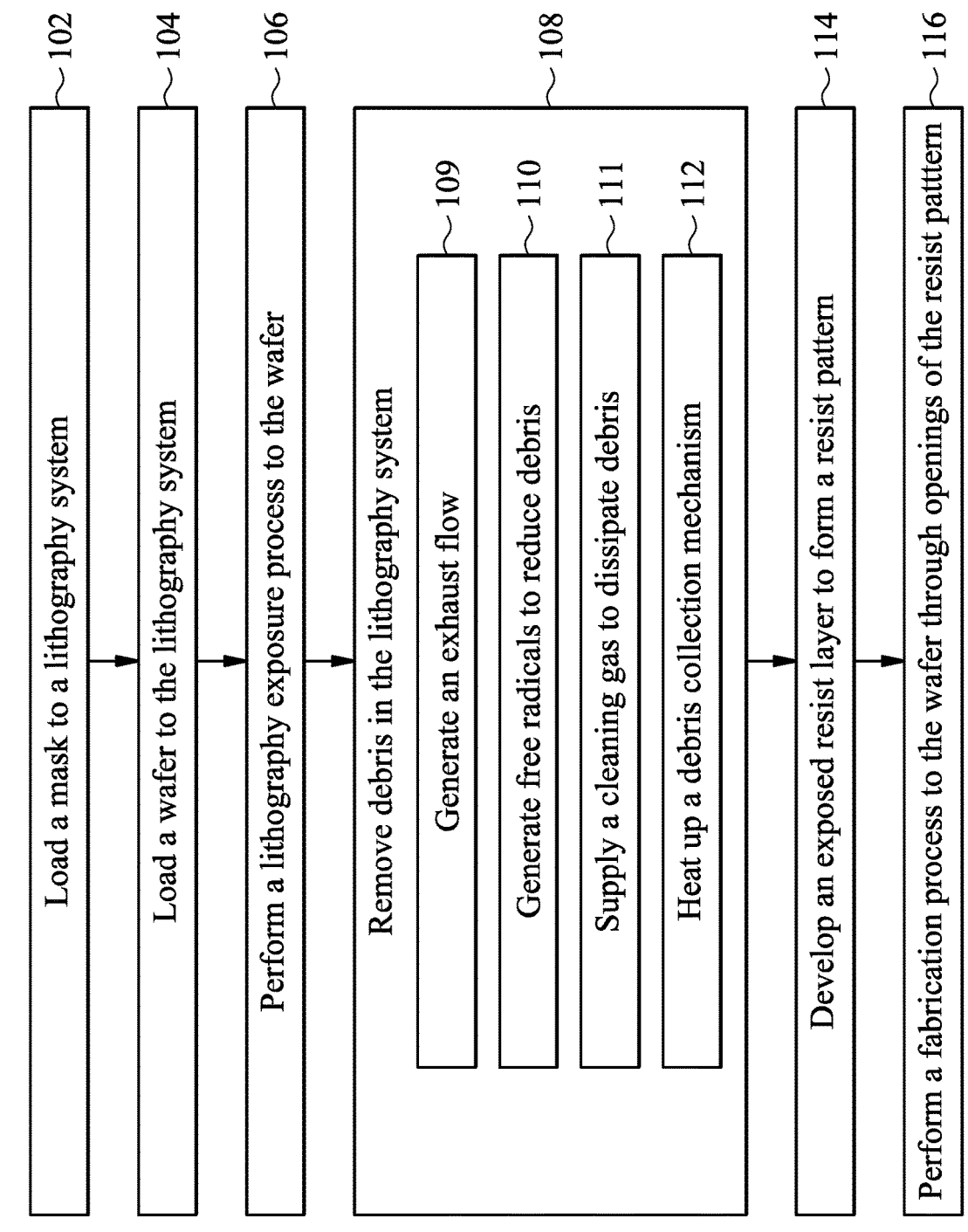
FIG. 5 is a flowchart of a method for a lithography exposure process, in accordance with some embodiments.

FIG. 5 is a flowchart of a method 100 for a lithography process implemented by the lithography system 10 in FIG. 2 or the lithography system 10a in FIG. 4, constructed in accordance with some embodiments. For brevity, operations of the method 100 are described with reference to the lithography system 10. Additional operations may be provided before, during, and after the method 100, and some operations described may be replaced, eliminated, or moved around for additional embodiments of the method. The method 100 is an example, and is not intended to limit the present disclosure beyond what is explicitly recited in the claims.

The method 100 includes an operation 102 which loads an EUV mask, such as mask 18, to the lithography system 10 that is operable to perform an EUV lithography exposure process. The mask 18 includes an IC pattern to be transferred to a semiconductor substrate, such as the wafer 22. The operation 102 may further include various steps, such as securing the mask 18 on the mask stage 16 and performing an alignment.

The method 100 includes an operation 104 which loads the wafer 22 to the lithography system 10, particularly on the wafer stage 24. The wafer 22 is coated with a resist layer. In the present embodiment, the resist layer is sensitive to the EUV light 90 from the radiation source 12 of the lithography system 10.

The method 100 includes an operation 106 by performing a lithography exposure process on the wafer 22 in the lithography system 10. In the operation 106, the target droplet generator 26 and the laser source configuration 28 are operated synchronously to heat up the target droplets 27, thereby generating EUV light 90. The EUV light 90 is collected, reflected and focused by the collector 31 and is transmitted out of the source vessel 25 via the output port 250.

Afterwards, the EUV light 90 from the radiation source 12 is illuminated on the mask 18 (by the illuminator 14), and is further projected on the resist layer coated on the wafer 22 (by the POB 20), thereby forming a latent image on the resist layer. In some embodiments, the lithography exposure process is implemented in a scan mode.

The method 100 includes an operation 108 by reducing debris produced in the radiation source 12. In some embodiments, as shown in FIG. 5, ions, gases and atoms of the target droplet (collectively referred to debris P) may deposit on elements of the radiation source 12 (such as collector 31), thereby causing contamination thereon. In order to reduce or remove the debris P in the radiation source 12, at least one of the operations 109-112 described below are conducted.

Figure 6:
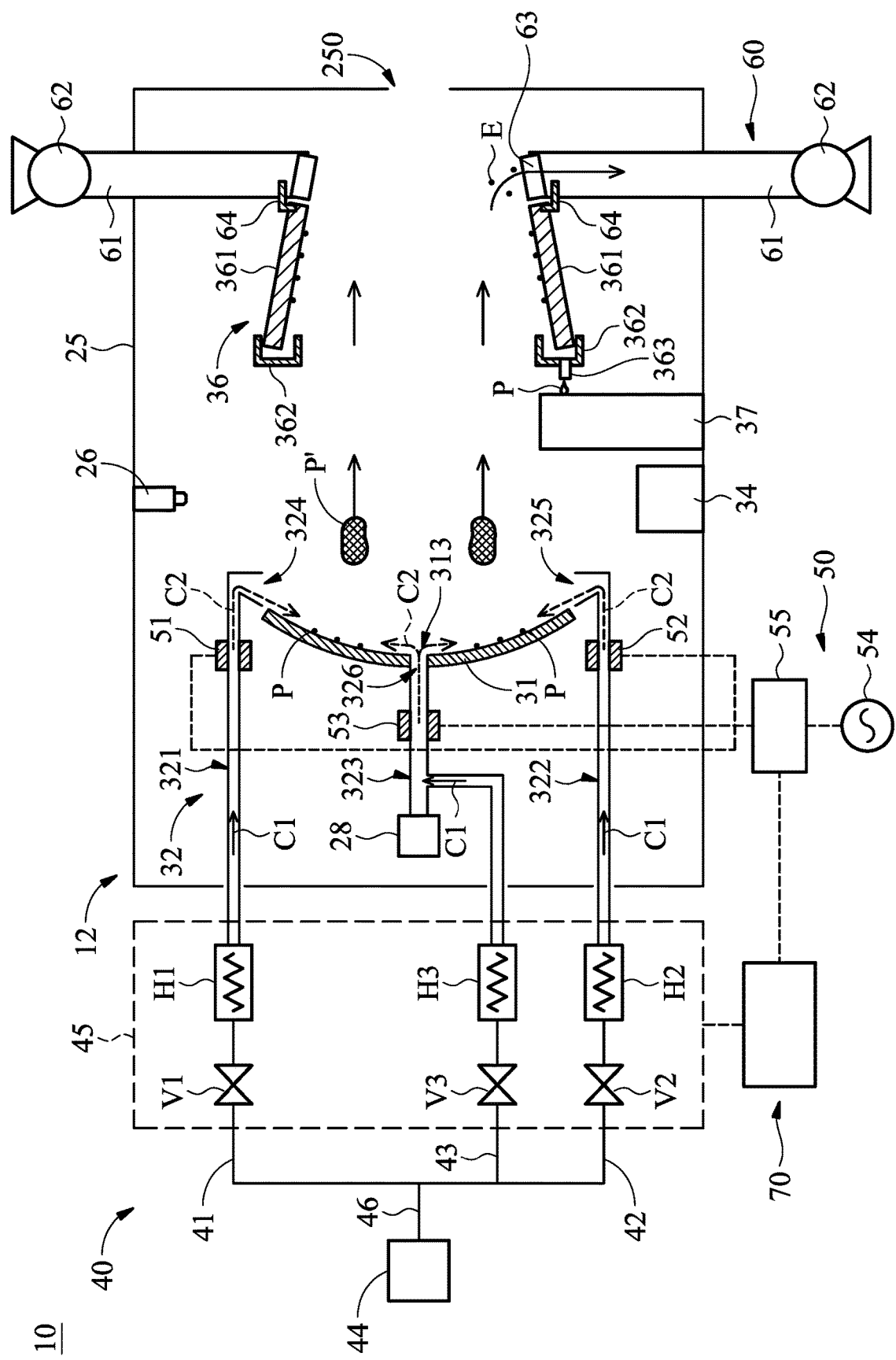
FIG. 6 is a schematic view of one stage of a method for a lithography exposure process, in accordance with some embodiments, wherein a free-radical product including a cleaning gas and free radicals of the cleaning gas is discharged over a collector to chemically react with debris on the collector.

In operation 109, as shown in FIG. 6, an exhaust flow E is generated by the exhaust module 60 to remove a portion of the debris P in the radiation source 12. The exhaust flow E may either remove the debris P floating in the radiation source 12 or remove the debris P trapped by the vanes 361.

In some embodiments, since the heated scrubber 63 is operated at a temperature higher than a melting temperate of the debris P, the debris P which attached on the surface of fan of heated scrubber 63 will not condense into solid form but flows freely into the scrubber gutter 64 and follows the next vane structure of DCM 36. As a result, the debris P is trapped by the heated scrubber 63 and the scrubber gutter 64. Therefore, the pump 62 may be protected from being damaged by the debris from the source vessel 25.

In operation 110, free-radicals are generated in the radiation source 12 to clean the elements in the radiation source 12. In some embodiments, free radicals of a cleaning gas C1 are produced to clean the collector 31. The method for generating the free radicals of the cleaning gas C1 includes supplying the cleaning gas C1 over the collector 31 via a gas flowing path (e.g., via the pipelines 41, 42 and 43 and the flow guiding members 321, 322 and 323). The method for generating the free radicals of the cleaning gas C1 further includes applying an electromagnetic radiant energy, such as microwaves, into the cleaning gas C1 via the second energy converters 51, 52 and 53 to radicalize at least a portion of the cleaning gas C1 to free radicals by plasma energy.

Alternatively, the method for generating the free radicals of the cleaning gas C1 includes supplying the cleaning gas C1 over the collector 31 via a gas flowing path (e.g., via the pipelines 41, 42 and 43 and the flow guiding members 321, 322 and 323). The method for generating the free radicals of the cleaning gas C1 further includes applying a thermal energy into the cleaning gas C1 by the first energy converters H1, H2 and H3 to radicalize a portion of the cleaning gas C1 to free radicals. In the cases where the cleaning gas C1 is radicalized by the thermal energy from the first energy converters H1, H2 and H3, the electromagnetic radiant energy may not be used to transform the cleaning gas C1 to the free radicals.

In some embodiments, the thermal energy and the electromagnetic radiant energy are sequentially used to radicalize the cleaning gas C1 to free radicals. For example, the thermal energy is applied into the cleaning gas C1 by the first energy converters H1, H2 and H3 to actively pre-heat the cleaning gas C1 at a temperature that improves the conversion efficiency of the cleaning gas into free radicals. Afterwards, the electromagnetic radiant energy is applied into the cleaning gas C1 by the second energy converters 51, 52 and 53 to radicalize the cleaning gas C1 to free radicals. Since the cleaning gas C1 is pre-heated in advance, a higher radicalization rate of the cleaning gas C1 may be achieved, which results in a higher cleaning efficiency for reducing the debris P on the collector 31.

After a portion of cleaning gas C1 is transformed to free radicals, the free radicals and the remaining cleaning gas C1 (collectively referred to free-radical product C2) are discharged to the collector 31 via the gas holes 324, 325 and 326 and flow to the coating surface of the collector 31. In some embodiments, the free-radical product C2 from the flow guiding members 321 and 322 is discharged over a peripheral area 315 (FIG. 3) of the collector 31 that is adjacent to a circumference 311 of the collector 31. In addition, the free-radical product C2 from the flow guiding member 323 is discharged over a central area 317 (FIG. 3) of the collector 31 that is adjacent to the aperture 313

Due to the high reactivity of the free radicals in the free-radical product C2, the free-radical product C2 reacts with most of the debris P accumulated on the collector 31 and form a gaseous product P'. In some embodiments, operation 109 and operation 110 are conducted simultaneously, and the gaseous product P' is pumped out by exhaust module 60, and the gaseous product P' is then discarded.

In one certain embodiment, the debris P contains tin, and the cleaning gas C1 includes hydrogen gas. When the free-radical product C2 reaches to the coating surface of the collector 31, the free-radical product C2 reacts chemically with tin to form gaseous stannane (SnH4). As a result, gas compounds may be exhausted by the internal flow system design. However, it should be appreciated that when the target droplet used to generate EUV radiation is made of a different material than Sn, the same or a different cleaning gas may be used as the catalytic material layer.

In some embodiments, the free-radical product C2 is supplied to contaminated areas of the collector 31. The contaminated areas may be determined according an archive data associated with the location of the collector 31 where the accumulation of the debris P tends to take place.

For example, as shown in FIG. 3, the archive data shows a lower portion of the collector 31 that is adjacent to the flow guiding member 322 tends to be contaminated by the debris P. In order to improve the efficiency for reducing the debris P and reduce the amount of the cleaning gas C1 used to cleaning, the cleaning gas C1 is discharged from the flow guiding member 322, but less or no cleaning gas C1 is discharged from the flow guiding member 321. The different flowing rates between the flow guiding member 321 and the flow guiding member 322 may be controlled through sending varied controlled signals to the flow rate regulators V1 and V2 by the controller 70 (FIG. 2). In some embodiments, the archive data may be recorded according to one or more previous maintaining process of the radiation source 12. Alternatively, the archive data may be produced according to a real-time image of the collector 31.

Figure 7:
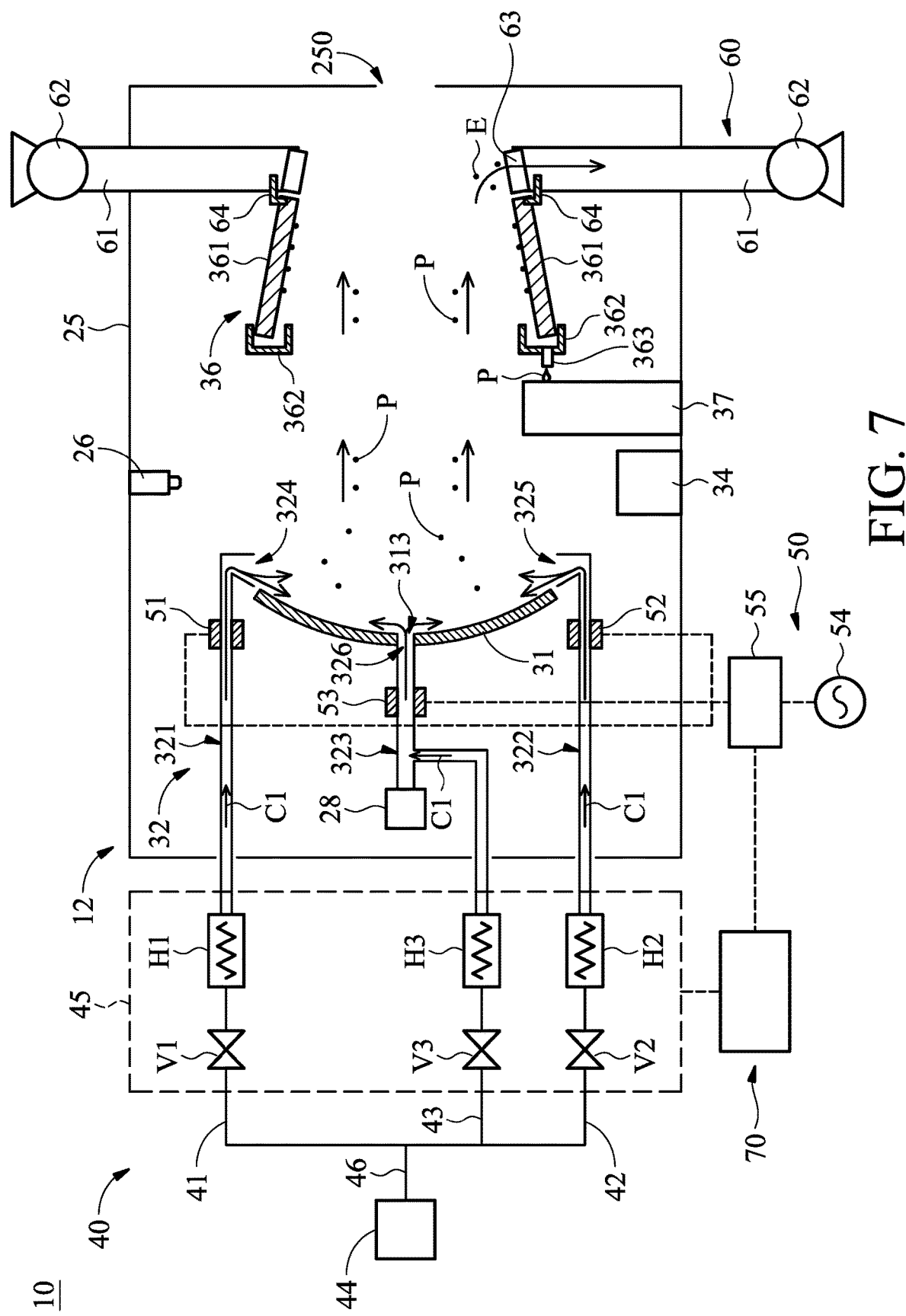
FIG. 7 is a schematic view of one stage of a method for a lithography exposure process, in accordance with some embodiments, wherein a cleaning gas is discharged over a collector to physically remove debris on the collector.

In operation 111, the cleaning gas C1 is supplied into the radiation source 12 to physically carry the debris P out of the radiation source 12. In some embodiments, as shown in FIG. 7, the cleaning gas C1 is supplied over the collector 31 to dissipate debris P accumulated on the collector 31 by the flow guiding members 321, 322 and 323. The blown debris P may be treated as the tin dust, which is pumped out by the exhaust module 60. Eventually, the debris P is discarded. It should be mentioned that not only tin dust but also SnH4 compounds may be exhausted simultaneously by this physical mechanism. In some embodiments, the cleaning gas C1 from the flow guiding members 321, 322 is discharged over the peripheral area 315 (FIG. 3) of the collector 31 that is adjacent to the circumference 311 of the collector 31. In addition, the cleaning gas C1 from the flow guiding member 323 is discharged over the central area 317 (FIG. 3) of the collector 31 that is adjacent to the aperture 313.

The cleaning gas C1 may be ejected over the collector 31 at a relatively high flow speed. Alternatively, the cleaning gas C1 is discharged over the collector 31 multiple times to intermittently apply an external force on the debris P. In cases where the cleaning gas C1 is intermittently supplied, a predetermined period is set between two of the supplies of the cleaning gas C1. During the predetermined period the flow rate regulators V1, V2 and V3 may be turned off by the controller 70 to pause the supply of the cleaning gas C1. Alternatively, during the predetermined period the flow rate regulators V1, V2 and V3 may be controlled by the controller 70 to reduce the flow rate of the cleaning gas C1. Therefore, the cleaning gas may have a pulse property to generate blowing and purging. The predetermined period may be less than such about 2 minutes, and the time period for supplying the cleaning gas C1 may be longer than about 5 minutes. For instance, 1 hr cleaning flush may consist of around 9 cleaning pulse periods. Additionally, this physical cleaning mechanism may be also applied for the source vessel maintenance.

In some embodiments, the cleaning gas C1 used to dissipate the debris P is heated up by the first energy converters H1, H2 and H3 before the cleaning gas C1 is discharged over the collector 31. Since the cleaning gas C1 is pre-heated in advance, the cleaning gas C1 may be more efficiently radicalized by plasma, generated in the pipelines 41, 42 and 43 by second energy converters 51, 52 and 53, or EUV photo-ionization or thermal energy produced during the generation of EUV light 90. As a result, the debris P may be removed from the collector 31 through a chemical reaction of the free radicals of the cleaning gas C1 and debris P in addition to the physical force.

In some embodiments, operations 109-111 are performed in sequence or simultaneously. Therefore, the intermittently supplied cleaning gas C1 in operation 111 also helps the gaseous product P' produced in operation 110 to leave the vicinity of the collector 31 and prevents the collector 31 from being contaminated. As shown in FIG. 6, the debris P trapped by the vanes 361 flows freely into the bucket 37 that is positioned below the vanes 361 to keep the vanes 361 from being clogged by the debris P Operations 109-112 may be performed during an interval between two consecutive operations 106 or may be performed while operation 106 is being conducted. Because the collector 31 and other elements in the radiation source 12 are cleaned while the lithography system 10 is operating, the gaseous product P' (such as gaseous stannane) has a relatively short lifespan and will easily turn back into debris P (such as tin).

In operation 112, DCM 36 is heated to remove debris P trapped by the vanes 361. In some embodiments, the DCM 36 is heated to a temperature in a range from about 100° C. to about 400° C. to allow the vanes 361 to operate at a temperature that is higher than the melting point of the debris P. As a result, as downtime for cleaning the radiation source 12 may be reduced or avoided, and the throughput of the lithography system 10 is improved.

The method 100 may include other operations to complete the lithography process. For example, the method 100 may include an operation 114 by developing the exposed resist layer to form a resist pattern having a plurality of openings defined thereon. In particular, after the lithography exposure process of operation 106, the wafer 22 is transferred out of the lithography system 10 to a developing unit, for example, to perform a developing process on the resist layer.

The method 100 may further include other operations, such as an operation 116 to perform a fabrication process on the wafer 22 through the openings of the resist pattern. In one example, the fabrication process includes an etch process on the wafer 22 using the resist pattern as an etch mask. In another example, the fabrication process includes an ion implantation process on the wafer 22 using the resist pattern as an implantation mask.

Although not intended to be limiting, one or more embodiments of the present disclosure provide many benefits to the manufacturing of semiconductor devices. For example, embodiments of the present disclosure provide apparatus and methods for effectively reducing contamination on collector, thereby extending its usable lifetime. In addition, the apparatus and methods provided herein enable in-line maintenance of the lithography system, thereby reducing the downtime of the lithography system and increasing the throughput thereof. Embodiments of the present disclosure may be implemented or integrated into existing EUV lithography systems.

In accordance with some embodiments, a method for a lithography exposure process is provided. The method includes irradiating a target droplet with a laser beam to create an extreme ultraviolet (EUV) light. The method further includes reflecting the EUV light with a collector. The method also includes discharging a cleaning gas over the collector through a gas distributor positioned next to the collector. A portion of the cleaning gas is converted to free radicals before the cleaning gas leaves the gas distributor, and the free radicals are discharged over the collector along with the cleaning gas.

In accordance with some embodiments, a method for a lithography exposure process is provided. The method include irradiating a target droplet with a laser beam to create an EUV light. The method further includes reflecting the EUV light with a collector. The method also includes performing a lithography exposure process on a wafer with the EUV light which is reflected by the collector. In addition, the method includes discharging a cleaning gas over the collector multiple times. A predetermined period is set between two of the supplies of the cleaning gas, and during the predetermined period the supply of the cleaning gas is paused.

In accordance with some embodiments, a radiation source for generating light for a lithography exposure process is provided. The radiation source includes a target droplet generator configured to generate a target droplet. The radiation source further includes a preheated laser source, a main laser source and a collector. The preheated laser is configured to hit a droplet and form a precursor target. Further, the main laser configured to generate a laser beam with a higher power to convert the precursor target more efficiently to generate an EUV light. The collector is configured to collect and reflect the EUV light. The radiation source also includes a gas flowing path configured to discharge a cleaning gas to the collector. In addition, the radiation source includes an energy converter and a controller. The energy converter such as a radio frequency generator or a thermal heater is configured to connect to the gas flowing path. The controller is configured to control an energy applied into the cleaning gas in the gas flowing path from the energy converter to convert a portion of the cleaning gas in the gas flowing path into free radicals.

Although the embodiments and their advantages have been described in detail, it should be understood that various changes, substitutions, and alterations may be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for a lithography exposure process, comprising:
    irradiating a target droplet with a laser beam to create an extreme ultraviolet (EUV) light;
    reflecting the EUV light with a collector;
    discharging a cleaning gas over the collector through a gas distributor positioned next to the collector, wherein the gas distributor includes two flow guiding members at two outer sides of the collector and flow rates in the flow guiding members are different, a portion of the cleaning gas is converted to free radicals before the cleaning gas leaves the gas distributor, and the free radicals are discharged over the collector along with the cleaning gas;
    applying an electromagnetic radiant energy into the cleaning gas positioned in the gas distributor to convert the portion of the cleaning gas to the free radicals before discharging the cleaning gas; and
    applying a thermal energy into the cleaning gas before applying the electromagnetic radiant energy to heat up the cleaning gas.

2. The method for a lithography exposure process as claimed in claim 1, wherein the free radicals and the cleaning gas are supplied to a central area of the collector through which the laser beam passes the collector to irradiate the target droplet.

3. The method for a lithography exposure process as claimed in claim 1, wherein the free radicals and the cleaning gas are supplied to a peripheral area of the collector that is adjacent to a circumference of the collector.

4. The method for a lithography exposure process as claimed in claim 1, further comprising:
    determining at least one contaminated area of the collector according to an estimated contamination status of the collector;
    wherein the free radicals and the cleaning gas are supplied to the contaminated area.

5. The method for a lithography exposure process as claimed in claim 1, further comprising:
    reducing accumulated debris on the collector to a gaseous product with the free radicals;
    exhausting the gaseous product via an exhaust line; and
    heating up the exhaust line to a predetermined temperature that is above a melting point of the debris.

6. The method for a lithography exposure process as claimed in claim 1, wherein the cleaning gas comprises hydrogen, and the free radicals of the cleaning gas are configured to reduce debris comprising tin accumulated on the collector.

7. The method for a lithography exposure process as claimed in claim 1, further comprising:
    supplying the free radicals and the cleaning gas over the collector multiple times, wherein a predetermined period is set between two of the supplies of the free radicals and the cleaning gas, and during the predetermined period the supply of the free radicals and the cleaning gas is paused.

8. The method for a lithography exposure process as claimed in claim 1, wherein each of the flow guiding member includes an end portion, the end portion has two inner walls which intersects with an optical axis at an angle less than 90 degrees, and one of the inner walls of the end portion is extends toward the collector, and the other one of the inner walls of the end portion is extended along a direction substantially perpendicular to an optical axis, so that the cleaning gas discharged by the flow guiding members forms a gas shield.

9. A method for lithography exposure process, comprising:
- irradiating a target droplet with a laser beam to create an extreme ultraviolet (EUV) light;
- reflecting the EUV light with a collector;
- performing a lithography exposure process on a wafer with the EUV light which is reflected by the collector;
- discharging a cleaning gas over the collector multiple times through two flow guiding members at two outer sides of the collector during the lithography exposure process, wherein a predetermined period is set between two of the supplies of the cleaning gas, and during the predetermined period the supply of the cleaning gas is paused;
- applying energy into the cleaning gas to generate free radicals before the cleaning gas is supplied to the collector, wherein the energy comprises an electromagnetic radiant energy; and
- heating up the cleaning gas before applying the electromagnetic radiant energy to the cleaning gas;
- wherein flow rates in the flow guiding members are different.

10. The method for a lithography exposure process as claimed in claim 9, wherein the cleaning gas is supplied to a central area of the collector through which the laser beam passes the collector to irradiate the target droplet.

11. The method for a lithography exposure process as claimed in claim 9, wherein the cleaning gas is supplied to a peripheral area of the collector that is adjacent to a circumference of the collector.

12. The method for a lithography exposure process as claimed in claim 9, further comprising:
- determining at least one contaminated area of the collector according to an archive database;
- wherein the cleaning gas is supplied to the contaminated area.

13. The method for a lithography exposure process as claimed in claim 9, further comprising:
- dissipating accumulated debris on the collector with the cleaning gas;
- exhausting the debris and the cleaning gas via an exhaust line; and
- heating up the exhaust line to a predetermined temperature that is above a melting point of the debris.

14. The method for a lithography exposure process as claimed in claim 9, further comprising:
- discharging the free radicals along with the cleaning gas over the collector, wherein the free radicals chemically react with the accumulated debris on the collector.

15. The method for a lithography exposure process as claimed in claim 9, wherein each of the flow guiding member includes an end portion, the end portion has two inner walls which intersects with an optical axis at an angle less than 90 degrees, and one of the inner walls of the end portion is extends toward the collector, and the other one of the inner walls of the end portion is extended along a direction substantially perpendicular to an optical axis, so that the cleaning gas discharged by the flow guiding members forms a gas shield.

16. A radiation source for generating light for a lithography exposure process, comprising:
- a target droplet generator configured to generate a target droplet;
- a preheated laser source configured to hit the target droplet and then generate a precursor target;
- a main laser source configured to generate a laser beam to convert the precursor target to an extreme ultraviolet (EUV) light; and
- a collector configured to collect and reflect the EUV light;
- a gas flowing path configured to discharge a cleaning gas to the collector;
- a first energy converter connected to the gas flowing path;
- a second energy converter connected to the gas flowing path;
- a controller configured to control a thermal energy applied into the cleaning gas in the gas flowing path from the first energy converter and then control an electromagnetic radiant energy applied into the cleaning gas from the second energy converter to convert a portion of the cleaning gas in the gas flowing path into free radicals; and
- a debris collection mechanism, disposed along an optical axis and including vanes and a bottom vane gutter, wherein the vanes are configured to trap debris, and the bottom vane gutter is configured to gather the debris flowing along the vanes.

17. The radiation source for generating light for a lithography exposure process as claimed in claim 16, wherein the second energy converter includes an electrode configured to convert an electric energy to the electromagnetic radiant energy.

18. The radiation source for generating light for a lithography exposure process as claimed in claim 16, wherein the first energy converter includes a heating member configured to convert an electric energy to the thermal energy.

19. The radiation source for generating light for a lithography exposure process as claimed in claim 16, further comprising:
- a flow rate regulator configured to adjust a flow rate of the cleaning gas supplied by the gas flowing path;
- wherein the controller is also configured to repeatedly turn on and turn off the flow rate regulator.

20. The radiation source for generating light for a lithography exposure process as claimed in claim 16, wherein the radiation source further comprises an exhaust module, connected to the debris collection mechanism, the exhaust module includes a heated scrubber configured to heating debris, and the debris is heated is collected and drained into the vanes.

* * * * *